(12) United States Patent
Chen et al.

(10) Patent No.: US 7,294,576 B1
(45) Date of Patent: Nov. 13, 2007

(54) TUNABLE SELECTIVITY SLURRIES IN CMP APPLICATIONS

(75) Inventors: Zhan Chen, Aurora, IL (US); Robert Vacassy, Aurora, IL (US); Benjamin Bayer, Ashland, VA (US); Dinesh Khanna, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 11/478,023

(22) Filed: Jun. 29, 2006

(51) Int. Cl.
*H01L 21/302* (2006.01)
(52) U.S. Cl. .................................... 438/692; 438/693
(58) Field of Classification Search ................ 438/689, 438/690, 691, 692, 693; 252/79.1–79.5
See application file for complete search history.

(56) References Cited

U.S. PATENT DOCUMENTS

| | | | |
|---|---|---|---|
| 5,196,353 A | 3/1993 | Sandhu et al. | |
| 5,230,833 A | 7/1993 | Romberger et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,858,813 A * | 1/1999 | Scherber et al. ............ 438/693 |
| 5,872,633 A | 2/1999 | Holzapfel et al. | |
| 5,893,796 A | 4/1999 | Birang et al. | |
| 5,949,927 A | 9/1999 | Tang | |
| 5,958,288 A | 9/1999 | Mueller et al. | |
| 5,964,643 A | 10/1999 | Birang et al. | |
| 5,980,775 A | 11/1999 | Grumbine et al. | |
| 6,015,506 A | 1/2000 | Streinz et al. | |
| 6,068,787 A | 5/2000 | Grumbine et al. | |
| 6,083,419 A * | 7/2000 | Grumbine et al. ......... 252/79.1 |
| 6,136,711 A * | 10/2000 | Grumbine et al. .......... 438/692 |
| 6,461,230 B1 * | 10/2002 | Tsai et al. ..................... 451/57 |
| 7,014,699 B2 | 3/2006 | Winter et al. | |
| 7,029,508 B2 | 4/2006 | Scott et al. | |
| 2001/0037821 A1 * | 11/2001 | Staley et al. ............... 134/25.4 |
| 2003/0162399 A1 * | 8/2003 | Singh .......................... 438/692 |
| 2004/0089634 A1 * | 5/2004 | Grover et al. ................. 216/89 |
| 2004/0229461 A1 * | 11/2004 | Darsillo et al. ............. 438/689 |

FOREIGN PATENT DOCUMENTS

| WO | WO 2004/031455 A2 | 4/2004 |
|---|---|---|
| WO | WO 2004/101222 A2 | 11/2004 |

OTHER PUBLICATIONS

S.Wolf, "Silicon Processing for the VLSI Era", 2002, Lattice Press, vol. 4, pp. 366-370.*

* cited by examiner

*Primary Examiner*—Kin-Chan Chen
(74) *Attorney, Agent, or Firm*—Thomas E. Omholt; Susan L. Steele

(57) ABSTRACT

The invention provides a method of preparing a chemical-mechanical polishing composition for polishing a substrate with at least a first layer and a second layer. The method comprises providing both a first chemical-mechanical polishing composition comprising an abrasive with a selectivity for a first layer as compared to a second layer and a second chemical-mechanical polishing composition comprising an abrasive with different selectivity for the first layer as compared to the second layer, wherein the second chemical-mechanical polishing composition is stable in the presence of the first chemical-mechanical polishing composition, and mixing the first and second chemical-mechanical polishing compositions in a ratio to achieve a final selectivity for the first layer as compared to the second layer. The invention further provides a method of chemically-mechanically polishing a substrate.

13 Claims, 1 Drawing Sheet

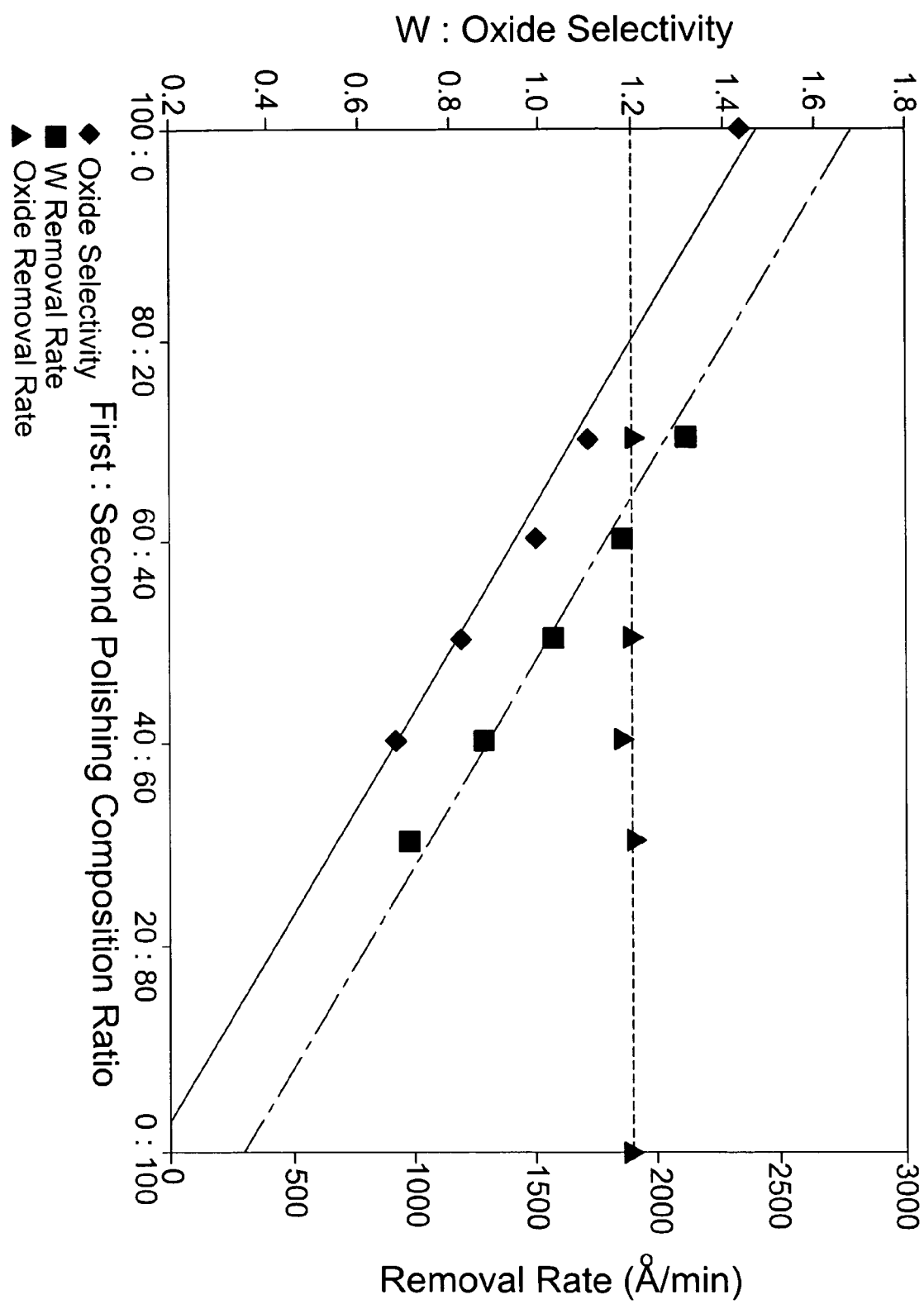

TUNABLE SELECTIVITY SLURRIES IN CMP APPLICATIONS

FIELD OF THE INVENTION

This invention pertains to a method of preparing a chemical-mechanical polishing composition and a method of polishing a substrate using the same.

BACKGROUND OF THE INVENTION

Integrated circuits are made up of millions of active devices formed in or on a substrate, such as a silicon wafer. The active devices are chemically and physically connected into a substrate and are interconnected through the use of multilevel interconnects to form functional circuits. Typical multilevel interconnects comprise a first metal layer, an interlevel dielectric layer, and a second and sometimes subsequent metal layer(s).

As layers of materials are sequentially deposited onto and removed from the substrate, some portions of the uppermost surface of the substrate may need to be removed. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization also is useful in forming features on a substrate by removing excess deposited material used to fill the features and to provide a level surface for subsequent levels of metallization and processing.

Chemical-mechanical planarization, or chemical-mechanical polishing (CMP), is a common technique used to planarize substrates. CMP utilizes a chemical composition, typically a slurry or other fluid medium, for removal of material from the substrate. In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad is moved relative to the substrate by an external driving force. The relative movement of the pad and substrate serves to abrade the surface of the substrate to remove a portion of the material from the substrate surface, thereby polishing the substrate. The polishing of the substrate by the relative movement of the pad and the substrate typically is further aided by the chemical activity of the polishing composition and/or the mechanical activity of an abrasive suspended in the polishing composition.

The polishing composition may exhibit either a high or a low selectivity with respect to the particular layer or material being removed by the polishing process. When CMP is performed with a polishing composition having a high selectivity, the removal rate of the selected material is significantly higher than that of other material(s) exposed at the surface of the substrate being polished. Conversely, when CMP is performed with a polishing composition having a low selectivity, each material present on the substrate surface being polished is removed at substantially the same rate. Non-selective slurries may advantageously improve topography, i.e., reduce dishing and erosion, as compared to selective slurries over a wider range of surface features or patterns.

In addition to the polishing composition, the CMP apparatus and the surface pattern on the substrate affect selectivity during the polishing step. However, the aforementioned factors are unique to the end user, i.e., the device manufacturer. Accordingly, a fixed-selectivity polishing composition will not exhibit the identical selectivity in the hands of one device manufacturer as compared to another. For example, a polishing composition designed to be non-selective for a substrate containing a metal layer and a dielectric layer may not exhibit 1:1 selectivity during polishing of actual substrates, leading to undesirable erosion. Thus, a need exists for polishing compositions with tunable selectivities, allowing the end-user to easily optimize polishing performance for specific substrates and/or apparatus. Particularly, a need exists for polishing compositions capable of being tuned by the end-user to non-selectively remove a metal layer and a dielectric layer with nearly equal polishing rates during a single CMP polishing step.

The invention provides such a method of preparing a tunable polishing composition. These and other advantages of the invention, as well as additional inventive features, will be apparent from the description of the invention provided herein.

BRIEF SUMMARY OF THE INVENTION

The invention provides a method of preparing a chemical-mechanical polishing composition for polishing a substrate with at least a first layer and a second layer, which method comprises (a) providing a first chemical-mechanical polishing composition comprising an abrasive with a first selectivity for a first layer as compared to a second layer, (b) providing a second chemical-mechanical polishing composition comprising an abrasive with a second selectivity for the first layer as compared to the second layer, wherein the second chemical-mechanical polishing composition is stable in the presence of the first chemical-mechanical polishing composition, and wherein the first and second selectivities are different, and (c) mixing the first and second chemical-mechanical polishing compositions in a ratio to achieve a final selectivity for the first layer as compared to the second layer.

The invention further provides a method of chemically-mechanically polishing a substrate, which method comprises (a) providing a substrate with at least a first layer and a second layer, (b) preparing a final chemical-mechanical polishing composition comprising the steps of (i) providing a first chemical-mechanical polishing composition comprising an abrasive with a first selectivity for a first layer as compared to a second layer, (ii) providing a second chemical-mechanical polishing composition comprising an abrasive with a second selectivity for the first layer as compared to the second layer, wherein the second chemical-mechanical polishing composition is stable in the presence of the first chemical-mechanical polishing composition, and wherein the first and second selectivities are different, and (iii) mixing the first and second chemical-mechanical polishing compositions in a ratio to achieve a final chemical-mechanical polishing composition with a final selectivity for the first layer as compared to the second layer, (c) contacting the substrate with the final chemical-mechanical polishing composition, (d) moving the polishing pad relative to the substrate with the final chemical-mechanical polishing composition therebetween, and (e) abrading at least a portion of the substrate to polish the substrate.

BRIEF DESCRIPTION OF THE DRAWINGS

The FIGURE is a graph of tungsten (W) removal rate, oxide removal rate, and W:oxide selectivity as a function of the ratio of the first and the second chemical-mechanical polishing compositions in the final chemical-mechanical polishing composition.

DETAILED DESCRIPTION OF THE INVENTION

The invention relates to a method of preparing a chemical-mechanical polishing composition for polishing a substrate with at least a first layer and a second layer. The method allows for the preparation of a chemical-mechanical polishing composition having a final, desired selectivity, i.e., relative removal rate, between the materials of the first layer and the second layer.

The first layer and second layer are different and comprise different materials. The first and second layers can comprise any suitable materials, especially any materials suitable in the design and manufacture of integrated circuits. Preferably, the first layer comprises a metal layer, and the second layer comprises a dielectric layer. The metal layers can include aluminum, copper, nickel, iron, tungsten, tantalum, iridium, hafnium, titanium, ruthenium, platinum, gold, silver, oxides thereof, nitrides thereof, alloys thereof, and mixtures thereof. Preferably, the metal layer comprises tungsten. Dielectric layers can include silicon-based dielectric materials, such as silicon dioxide, doped silicon dioxide, and silicon oxynitride, and low K dielectrics. Preferably, the dielectric layer comprises silicon dioxide, doped silicon dioxide, or silicon oxynitride.

The final, desired selectivity for the first layer as compared to the second layer is achieved by mixing a first chemical-mechanical polishing composition and a second chemical-mechanical polishing composition in a specific ratio to form a "final" chemical-mechanical polishing composition. The first chemical-mechanical polishing composition has a first selectivity for the first layer as compared to the second layer, and the second chemical-mechanical polishing composition has a second selectivity for the first layer as compared to the second layer. Thus, the ratio of the amounts of the first polishing composition and the second polishing composition necessary to achieve a final chemical-mechanical polishing composition with the final, desired selectivity can be easily determined. Notably, by adjusting the ratio of the amounts of the first and second polishing compositions, the final selectivity of the final chemical-mechanical polishing composition can be readily tuned to meet the variable demands of the end-user, i.e., the device manufacturer.

The first polishing composition can have any suitable selectivity for the first layer as compared to the second layer. Typically, the first selectivity is from about 25:1 to about 1:1 (e.g., about 20:1 to about 1:1, about 10:1 to about 1:1, about 5:1 to about 1:1, about 2:1 to about 1:1, about 1.8:1 to about 1:1, about 1.5:1 to about 1:1, and about 1.2:1 to about 1:1). The second polishing composition can have any suitable selectivity for the first layer as compared to the second layer. Typically, the second selectivity is from about 0.04:1 to about 1:1 (e.g., about 0.1:1 to about 1:1, about 0.2:1 to about 1:1, about 0.5:1 to about 1:1, about 0.6:1 to about 1:1, about 0.8:1 to about 1:1). The first selectivity and the second selectivity are different. The first selectivity and the second selectivity cannot both be low, i.e., about 1:1.

The second polishing composition is stable in the presence of the first polishing composition. The term "stable" as used herein refers to both the chemical and physical stability of the polishing compositions. Thus, the components of the first polishing composition and the second polishing composition are not consumed upon mixing, either by decomposition or chemical reaction with each other. Moreover, the soluble components of the first and second compositions remain in solution upon mixing, and the insoluble components of the first and second compositions remain suspended upon mixing.

The first and second polishing compositions comprise an abrasive. Typically, the abrasive is present in the first and second polishing compositions in an amount of about 0.1 wt. % or more (e.g., about 0.5 wt. % or more, or about 1 wt. % or more) based on the total weight of the polishing composition. Typically, the abrasive is present in the first and second polishing compositions in an amount of about 20 wt. % or less (e.g., about 15 wt. % or less, about 10 wt. % or less, about 5 wt. % or less, or about 2.5 wt. % or less) based on the total weight of the first and second polishing compositions.

The abrasive can be any suitable abrasive, many of which are well known in the art. The abrasive desirably comprises a metal oxide. Suitable metal oxides include metal oxides selected from the group consisting of alumina, silica, titania, ceria, zirconia, germania, magnesia, co-formed products thereof, and combinations thereof. Preferably, the metal oxide is silica. The silica can be any suitable form of silica. Useful forms of silica include but are not limited to fumed silica, precipitated silica, and condensation-polymerized silica. Preferably, the silica is a condensation-polymerized silica. Condensation-polymerized silica particles typically are prepared by condensing $Si(OH)_4$ to form colloidal particles. The precursor $Si(OH)_4$ can be obtained, for example, by hydrolysis of high purity alkoxysilanes, or by acidification of aqueous silicate solutions. Such abrasive particles can be prepared in accordance with U.S. Pat. No. 5,230,833 or can be obtained as any of various commercially available products, such as the Fuso PL-1, PL-2, and PL-3 products, and the Nalco 1050, 2327, and 2329 products, as well as other similar products available from DuPont, Bayer, Applied Research, Nissan Chemical, and Clariant.

The abrasive particles can have any suitable size. The abrasive particles typically have an average primary particle size (e.g., average primary particle diameter) of about 5 nm to about 250 nm. Preferably, the abrasive particles have an average primary particle size of about 10 nm to about 100 nm. Most preferably, the abrasive particles have an average primary particle size of about 25 nm to about 80 nm.

The first and second polishing compositions comprise a liquid carrier. A liquid carrier is used to facilitate the application of the abrasive and any components dissolved or suspended therein to the surface of the substrate to be polished (e.g., planarized). The liquid carrier is typically an aqueous carrier and can be water alone (i.e., can consist of water), can consist essentially of water, can comprise water and a suitable water-miscible solvent, or can be an emulsion. Suitable water-miscible solvents include alcohols, such as methanol, ethanol, etc., and ethers, such as dioxane and tetrahydrofuran. Preferably, the aqueous carrier comprises, consists essentially of, or consists of water, more preferably deionized water.

The first and second polishing compositions can further comprise an inhibitor of metal etching. Classes of compounds that are useful inhibitors of metal etching include compounds having nitrogen-containing functional groups such as nitrogen-containing heterocycles, alkyl ammonium ions, amino alkyls, and amino acids. Examples of useful inhibitors of metal etching that include nitrogen-containing heterocyclic functional groups include 2,3,5-trimethylpyrazine, 2-ethyl-3,5-dimethylpyrazine, quinoxaline, acetyl pyrrole, pyridazine, histidine, pyrazine, benzimidazole, and mixtures thereof.

The term "alkyl ammonium ion" as used herein refers to nitrogen-containing compounds having functional groups that can produce alkyl ammonium ions in aqueous solutions. The level of alkylammonium ions produced in aqueous solutions including compounds with nitrogen-containing functional groups is a function of solution pH and the compound or compounds chosen. Examples of nitrogen-containing functional group inhibitors of metal etching that produce inhibitory amounts of alkyl ammonium ion functional groups at an aqueous solution pH of less than 9 include monoquat isies (isostearylethylimididonium), cetyltrimethyl ammonium hydroxide, alkaterge E (2-heptadecenyl-4-ethyl-2 oxazoline 4-methanol), aliquat 336 (tricaprylmethyl ammonium chloride), nuospet 101 (4,4 dimethyloxazolidine), tetrabutylammonium hydroxide, dodecylamine, tetramethylammonium hydroxide, and mixtures thereof. A preferred inhibitor of metal etching is tetrabutylammonium hydroxide.

Useful amino alkyl inhibitors of metal etching include, for example, aminopropylsilanol, aminopropylsiloxane, dodecylamine, and mixtures thereof. Additionally, useful inhibitors of metal etching include synthetic and naturally occurring amino acids such as lysine, tyrosine, glutamine, glutamic acid, glycine, cystine, and serine.

In a preferred embodiment, the inhibitor of metal etching is tetrabutylammonium hydroxide, glycine, or a combination thereof.

The inhibitor of metal etching can be present in any suitable amount. Typically, the inhibitor is present in the first and second polishing compositions in an amount of about 0.001 wt. % or more (e.g., about 0.005 wt. % or more, or about 0.01 wt. % or more). Typically, the inhibitor is present in the first and second polishing compositions in an amount of about 2 wt. % or less (e.g., about 1 wt. % or less, or 0.1 wt. % or less).

The first and second polishing compositions optionally further comprise one or more other additives. The first and second polishing compositions can comprise a surfactant and/or rheological control agent, including viscosity enhancing agents and coagulants (e.g., polymeric rheological control agents, such as, for example, urethane polymers). Suitable surfactants include, for example, cationic surfactants, anionic surfactants, anionic polyelectrolytes, nonionic surfactants, amphoteric surfactants, fluorinated surfactants, mixtures thereof, and the like.

The first and second polishing compositions can have any suitable pH. Typically, the first and second polishing compositions have a pH of about 9 or less (e.g., about 7 or less, about 6 or less, about 5 or less, or about 4 or less). The pH of the first and second polishing compositions can be the same or different.

The pH of the first and second polishing compositions can be achieved and/or maintained by any suitable means. More specifically, the first and second polishing compositions can further comprise a pH adjustor, a pH buffering agent, or a combination thereof. The pH adjustor can be any suitable pH-adjusting compound. For example, the pH adjustor can be nitric acid, potassium hydroxide, or a combination thereof. The pH buffering agent can be any suitable buffering agent, for example, phosphates, sulfates, acetates, borates, ammonium salts, and the like. The first and second polishing compositions can comprise any suitable amount of a pH adjustor and/or a pH buffering agent, provided that a suitable amount is used to achieve and/or maintain the pH of the polishing composition within the pH ranges set forth.

The first polishing composition can further comprise at least one catalyst. The catalyst may be metallic, non-metallic, or a combination thereof. Preferably, the catalyst is an iron catalyst. Suitable catalysts include inorganic salts of iron, such as iron (II or III) nitrates, iron (II or III) sulfates, iron (II or III) halides, including fluorides, chlorides, bromides, iodides, perchlorates, perbromates, and periodates, or an organic iron (II or III) compound, such as acetates, acetylacetonates, citrates, gluconates, malonates, oxalates, phthalates, and succinates. More preferably, the catalyst is iron (II or III) nitrate.

The catalyst can be present in the first polishing composition in any suitable amount. Typically, the catalyst is present in an amount of about 0.0001 wt. % or more (e.g., about 0.001 wt. % or more, about 0.005 wt. % or more, or about 0.01 wt. % or more). Typically, the catalyst is present in an amount of about 2 wt. % or less (e.g., about 0.5 wt. % or less, or about 0.05 wt. % or less).

The first polishing composition can further comprise a stabilizer. The stabilizer inhibits the catalyst from reacting with the oxidizing agent. Useful stabilizers include phosphoric acid, organic acids such as adipic acid, citric acid, malonic acid, othophthalic acid, and EDTA, phosphorate compounds, nitrile compounds such as benzonitrile, and mixtures thereof. Preferably, the stabilizer is malonic acid.

The stabilizer can be present in the first polishing composition in any suitable amount. Typically, the stabilizer is present in an amount ranging from about 1 equivalent per catalyst to about 15 equivalents per catalyst. More preferably, the stabilizer is present in an amount ranging from about 1 equivalent per catalyst to about 5 equivalents per catalyst.

After mixing the first and second polishing compositions, an oxidizing agent can be added to the resulting mixed (i.e., final) chemical-mechanical polishing composition. The oxidizing agent, in combination with the catalyst, oxidizes the first layer, i.e., the metal layer. The oxidizing agent used is preferably one or more inorganic or organic per-compounds. A per-compound as defined by Hawley's Condensed Chemical Dictionary is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzyl peroxide, peracetic acid, and di-t-butyl peroxide, monopersulfates ($SO_5^{2-}$), dipersulfates ($S_2O_8^{2-}$), and sodium peroxide.

Examples of compounds containing an element in its highest oxidation state include but are not limited to periodic acid, periodate salts, perbromic acid, perbromate salts, perchloric acid, perchloric salts, perboric acid, and perborate salts and permanganates. Examples of non-per compounds include but are not limited to bromates, chlorates, chromates, iodates, iodic acid, and cerium (IV) compounds such as ammonium cerium nitrate.

Preferably, the oxidizing agent is hydrogen peroxide.

The final polishing composition can have any suitable pH. Typically, the final polishing composition has a pH of about 9 or less (e.g., about 7 or less, about 6 or less, about or less, or about 4 or less).

The final polishing composition can be prepared by any suitable technique, many of which are known to those skilled in the art. The final polishing composition can be prepared in a batch or continuous process.

Generally, the final polishing composition can be prepared by combining the first polishing composition and the second polishing composition in any order and mixing by any method that is capable of incorporating the components into the polishing composition. The polishing composition also can be prepared by mixing the first and second polishing compositions at the surface of the substrate during the polishing operation.

The final polishing composition can be supplied as a two-package system comprising the first polishing composition and the second composition. Moreover, it is suitable for the components in the first or second containers to have different pH values, or alternatively to have substantially similar, or even equal, pH values. The oxidizing agent, such as hydrogen peroxide, can be supplied separately from the first and second polishing compositions and can be combined, e.g., by the end-user, with the first and second polishing compositions shortly before use (e.g., 1 week or less prior to use, 1 day or less prior to use, 1 hour or less prior to use, 10 minutes or less prior to use, or 1 minute or less prior to use). Other two-container, or three or more container, combinations of the components of the final polishing composition are within the knowledge of one of ordinary skill in the art.

The first and second polishing compositions also can be provided as a concentrate which is intended to be diluted with an appropriate amount of liquid carrier prior to use. In such an embodiment, for example, the first polishing composition concentrate can comprise the abrasive, the iron catalyst, a stabilizer, an inhibitor of metal etching, and a liquid carrier in amounts such that, upon dilution of the concentrate with an appropriate amount of liquid carrier, each component of the polishing composition will be present in the polishing composition in an amount within the appropriate range recited above for each component. For example, the abrasive, the iron catalyst, a stabilizer, an inhibitor of metal etching can each be present in the concentration in an amount that is about 2 times (e.g., about 3 times, about 4 times, or about 5 times) greater than the concentration recited above for each component so that, when the concentrate is diluted with an equal volume of liquid carrier (e.g., 2 equal volumes of liquid carrier, 3 equal volumes of liquid carrier, or 4 equal volumes of liquid carrier, respectively), each component will be present in the polishing composition in an amount within the ranges set forth above for each component. Similarly, in the second polishing composition, the abrasive and an inhibitor of metal etching can be present in the concentration in an amount that is about 2 times (e.g., about 3 times, about 4 times, or about 5 times) greater than the concentration recited above for each component so that, when the concentrate is diluted with an equal volume of liquid carrier (e.g., 2 equal volumes of liquid carrier, 3 equal volumes of liquid carrier, or 4 equal volumes of liquid carrier, respectively), each component will be present in the polishing composition in an amount within the ranges set forth above for each component. Furthermore, as will be understood by those of ordinary skill in the art, the concentrate can contain an appropriate fraction of the liquid carrier present in the final polishing composition in order to ensure that the abrasive, the iron catalyst, a stabilizer, an inhibitor of metal etching, and other suitable additives are at least partially or fully dissolved in the concentrate.

The invention also provides a method of polishing a substrate with at least a first layer and a second layer. The method of polishing a substrate comprises (a) providing a substrate with at least a first layer and a second layer, (b) preparing a final chemical-mechanical polishing composition comprising the steps of (i) providing a first chemical-mechanical polishing composition comprising an abrasive with a first selectivity for a first layer as compared to a second layer, (ii) providing a second chemical-mechanical polishing composition comprising an abrasive with a second selectivity for the first layer as compared to the second layer, wherein the second chemical-mechanical polishing composition is stable in the presence of the first chemical-mechanical polishing composition, and wherein the first and second selectivities are different, and (iii) mixing the first and second chemical-mechanical polishing compositions in a ratio to achieve a final chemical-mechanical polishing composition with a final selectivity for the first layer as compared to the second layers, (c) contacting the substrate with the final chemical-mechanical polishing composition, (d) moving the polishing pad relative to the substrate with the final chemical-mechanical polishing composition therebetween, and (e) abrading at least a portion of the substrate to polish the substrate.

In accordance with the invention, a substrate can be planarized or polished with the final polishing composition described herein by any suitable technique. The polishing method of the invention is particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the final polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example demonstrates tunable selectivities achieved by the inventive method.

The first chemical-mechanical polishing composition contains 5 wt. % condensation-polymerized silica (Nalco TX11005) with an average primary particle size of 25 nm, 0.0837 wt. % ferric nitrate, 69 ppm malonic acid, and 1250 ppm tetrabutylammonium hydroxide (TBAH). The first chemical-mechanical polishing composition exhibits a high removal rate for tungsten, i.e., about 2700 Å/min. The second chemical-mechanical polishing composition contains 5 wt. % condensation-polymerized silica (Nalco TX 11005) with an average particle diameter of 25 nm and 1250 ppm TBAH. The second chemical-mechanical polishing composition exhibits a high removal rate for oxide, i.e., about 1900 Å/min. The first and second polishing compositions were mixed in various ratios, and 4 wt. % hydrogen peroxide was added to produce 7 polishing compositions (1A, 1B, 1C, 1D, 1E, 1F, and 1G).

Similar substrates comprising a tungsten patterned wafer were polished with the 7 polishing compositions. The tungsten and oxide removal rate results are set forth in Table 1.

TABLE 1

Material Removal Rates and Selectivity as a Function of the Ratio of the First and Second Chemical-Mechanical Polishing Compositions

| Polishing Composition | Ratio of First Polishing Composition: Second Polishing Composition | Tungsten Removal Rate (Å/min) | Oxide Removal Rate (Å/min) | Selectivity of W:Oxide |
|---|---|---|---|---|
| 1A | 100:0 | 2711 | 1888 | 1.4 |
| 1B | 70:30 | 2100 | 1900 | 1.1 |
| 1C | 60:40 | 1843 | 1859 | 1 |
| 1D | 50:50 | 1558 | 1887 | 0.8 |
| 1E | 40:60 | 1270 | 1950 | 0.7 |
| 1F | 30:70 | 969 | 1902 | 0.5 |
| 1G | 0:100 | 304 | 1880 | 0.2 |

The data of Table 1 is plotted in the graph of the figure, which depicts tungsten removal rate, oxide removal, and the tungsten:oxide selectivity. The results demonstrate that selectivity is easily controlled while maintaining acceptable removal rates of both oxide and tungsten. In this example of tuning the selectivity, as the ratios of the first and second polishing compositions are varied, the tungsten removal rate is adjusted due to the changes in the iron catalyst concentration while the oxide removal rate is unchanged. Moreover, the ratio of the first polishing composition to the second polishing composition necessary to achieve a desired, final selectivity is easily calculated from the slope of the line corresponding to the tungsten:oxide selectivity. In this particular situation, the slope of the line is defined by Formula I:

$$\text{Selectivity} = 1.4723 - 0.0131 \times \% \text{ oxide component} \quad (I)$$

EXAMPLE 2

This example demonstrates tunable selectivities achieved by the inventive method.

A series of polishing experiments in which the abrasive concentration and catalyst concentration were systematically varied were conducted in order to elucidate the relationship between abrasive and catalyst concentration and tungsten and oxide removal rates. The abrasive was condensation-polymerized silica (Fuso) with an average primary particle size of 25 nm, and the catalyst was ferric nitrate. The concentrations of abrasive and catalyst and the material removal rates and tungsten:oxide selectivity results are set forth in Table 2.

TABLE 2

Material Removal Rates and Selectivity as a Function of Concentration of the Catalyst and the Abrasive

| Abrasive Concentration (wt. %) | Catalyst Concentration (ppm) | Tungsten Removal Rate (Å/min) | Oxide Removal Rate (Å/min) | Selectivity of W:Oxide |
|---|---|---|---|---|
| 2.707 | 34.9 | 4326 | 1785 | 2.4 |
| 3.000 | 22.5 | 4309 | 1910 | 2.3 |
| 2.000 | 22.5 | 4430 | 1450 | 3.1 |
| 2.707 | 10.1 | 2974 | 1767 | 1.7 |
| 2.000 | 40.0 | 4320 | 1519 | 2.8 |
| 1.293 | 10.1 | 3381 | 1112 | 3.0 |
| 1.293 | 34.9 | 4123 | 1160 | 3.6 |
| 2.000 | 22.5 | 4365 | 1437 | 3.0 |
| 2.000 | 5.0 | 1872 | 1513 | 1.2 |
| 2.000 | 22.5 | 4438 | 1437 | 3.1 |
| 1.000 | 22.5 | 4054 | 964 | 4.2 |

Based on the results set forth in Table 2, the mathematical models for tungsten oxide removal rate (Formula II) and oxide removal rate (Formula III) are as follows:

$$\text{Tungsten removal rate (Å/min)} = 1029 + 236[\text{catalyst concentration (ppm)}] - 612.7[\text{catalyst concentration (ppm)}]^2 \quad (II)$$

$$\text{Oxide removal rate (Å/min)} = 534 + 463[\text{abrasive concentration (wt. \%)}] \quad (III)$$

The results demonstrate that tungsten removal rate is only a function of catalyst concentration, and oxide removal rate is linearly dependent on abrasive concentration. Accordingly, a method of preparing a chemical-mechanical polishing composition with tunable selectivity can be designed based on Formula II and Formula III. For example, where the first chemical-mechanical polishing composition comprises 22.5 ppm of catalyst and 0.66 wt. % of abrasive, and the second chemical-mechanical polishing composition comprises 3 wt. % of abrasive, the tungsten removal rate, oxide removal rate, and tungsten:oxide selectivity can be calculated for the various ratios of the first chemical-mechanical polishing composition to the second chemical-mechanical polishing composition in the final chemical-mechanical polishing compositions. The results of the calculations are set forth in Table 3.

TABLE 3

Calculated Material Removal Rates and Selectivity as a Function of the Ratio of the First Chemical-Mechanical Polishing Composition and the Second Chemical-Mechanical Polishing Composition

| Ratio of First Polishing Composition to Second Polishing Composition | Tungsten Removal Rate (Å/min) | Oxide Removal Rate (Å/min) | W:Oxide Selectivity |
|---|---|---|---|
| 100:0 | 4319 | 765 | 5.6 |
| 95:5 | 4333 | 823 | 5.3 |
| 90:10 | 4323 | 881 | 4.9 |
| 85:15 | 4290 | 939 | 4.6 |
| 80:20 | 4233 | 997 | 4.2 |
| 75:25 | 4152 | 1055 | 3.9 |
| 70:30 | 4049 | 1112 | 3.6 |
| 65:35 | 3921 | 1170 | 3.4 |
| 60:40 | 3770 | 1228 | 3.1 |
| 55:45 | 3596 | 1286 | 2.8 |

TABLE 3-continued

Calculated Material Removal Rates and Selectivity as a Function of the Ratio of the First Chemical-Mechanical Polishing Composition and the Second Chemical-Mechanical Polishing Composition

| Ratio of First Polishing Composition to Second Polishing Composition | Tungsten Removal Rate (Å/min) | Oxide Removal Rate (Å/min) | W:Oxide Selectivity |
|---|---|---|---|
| 50:50 | 3398 | 1344 | 2.5 |
| 45:55 | 3177 | 1402 | 2.3 |
| 40:60 | 2832 | 1459 | 2.0 |
| 35:65 | 2664 | 1517 | 1.8 |
| 30:70 | 2373 | 1575 | 1.5 |
| 25:75 | 2057 | 1633 | 1.3 |
| 20:80 | 1719 | 691 | 1.0 |
| 15:85 | 1657 | 1749 | 0.8 |
| 10:90 | 971 | 1807 | 0.5 |
| 5:95 | 562 | 1864 | 0.3 |
| 0:100 | 129 | 1922 | 0.1 |

The results demonstrate that the final selectivity is easily controlled by the end user by choosing the appropriate ratio of the first chemical-mechanical polishing composition to the second chemical-mechanical polishing composition in the final chemical-mechanical polishing composition.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of chemically-mechanically polishing a substrate, which method comprises:
    (a) providing a substrate with at least a first layer and a second layer, wherein the first layer and the second layer have not been contacted with a chemical-mechanical polishing composition,
    (b) preparing a final chemical-mechanical polishing composition comprising the steps of:
        (i) providing a first chemical-mechanical polishing composition comprising an abrasive with a first selectivity for a first layer as compared to a second layer,
        (ii) providing a second chemical-mechanical polishing composition comprising an abrasive with a second selectivity for the first layer as compared to the second layer, wherein the second chemical-mechanical polishing composition is stable in the presence of the first chemical-mechanical polishing composition, and wherein the first and second selectivities are different, and
        (iii) mixing the first and second chemical-mechanical polishing compositions in a ratio to achieve a final chemical-mechanical polishing composition with a final selectivity for the first layer as compared to the second layer,
    (c) contacting the substrate with the final chemical-mechanical polishing composition,
    (d) moving the polishing pad relative to the substrate with the final chemical-mechanical polishing composition therebetween, and
    (e) abrading at least a portion of the first and second layers of the substrate to polish the substrate.

2. The method of claim 1, wherein the first layer is a metal layer, and the second layer is a dielectric layer.

3. The method of claim 2, wherein the first layer comprises tungsten.

4. The method of claim 2, wherein the second layer comprises silicon oxide.

5. The method of claim 1, wherein the first selectivity for the first layer as compared to the second layer is about 25:1 to about 1:1.

6. The method of claim 1, wherein the second selectivity for the first layer as compared to the second layer is about 0.04:1 to about 1:1.

7. The method of claim 1, wherein the first chemical-mechanical polishing composition further comprises:
    (a) an iron catalyst selected from the group consisting of inorganic iron compounds and organic iron compounds having multiple oxidation states,
    (b) at least one stabilizer selected from the group consisting of phosphoric acid, phthalic acid, citric acid, adipic acid, oxalic acid, malonic acid, benzonitrile, and mixtures thereof,
    (c) an inhibitor of metal etching selected from the group consisting of tetraalkylammonium hydroxides and amino acids, and
    (d) a liquid carrier.

8. The method of claim 7, wherein the iron catalyst is ferric nitrate, the stabilizer is malonic acid, the inhibitor is tetrabutylammonium hydroxide, and the abrasive is silica.

9. The method of claim 1, wherein the second chemical-mechanical polishing composition further comprises a tetraalkylammonium hydroxide and a liquid carrier.

10. The method of claim 9, wherein the tetraalkylammonium hydroxide is tetrabutylammonium hydroxide.

11. The method of claim 9, wherein the abrasive is silica.

12. The method of claim 1, further comprising (b)(iv) adding an oxidizing agent to the mixture of the first and second chemical-mechanical polishing compositions.

13. The method of claim 12, wherein the oxidizing agent is hydrogen peroxide.

* * * * *